United States Patent [19]

Feuerbaum

[11] 4,220,854

[45] Sep. 2, 1980

[54] METHOD FOR THE CONTACTLESS MEASUREMENT OF THE POTENTIAL WAVEFORM IN AN ELECTRONIC COMPONENT AND APPARATUS FOR IMPLEMENTING THE METHOD

[75] Inventor: Hans-Peter Feuerbaum, Munich, Fed. Rep. of Germany

[73] Assignee: Siemens Aktiengesellschaft, Munich, Fed. Rep. of Germany

[21] Appl. No.: 22,484

[22] Filed: Mar. 21, 1979

[30] Foreign Application Priority Data

Mar. 31, 1978 [DE] Fed. Rep. of Germany ....... 2813947

[51] Int. Cl.$^2$ ............................................. G01N 23/00
[52] U.S. Cl. ................................. 250/310; 324/158 D
[58] Field of Search ............... 250/306, 307, 310, 311, 250/397, 305; 324/158 D

[56] References Cited

U.S. PATENT DOCUMENTS

| | | | |
|---|---|---|---|
| 3,531,716 | 9/1970 | Tarui et al. | 250/310 |
| 3,549,999 | 12/1970 | Norton | 324/158 D |
| 3,764,898 | 10/1973 | Bohlen et al. | 250/310 |
| 3,956,698 | 5/1976 | Malmberg et al. | 324/158 D |

OTHER PUBLICATIONS

"Quantitative Voltage Contrast at High Frequencies in The Sem," Balk et al., *Scanning Electron Microscopy*, 1976, pp. 615–624.

*Primary Examiner*—Bruce C. Anderson
*Attorney, Agent, or Firm*—Kenyon & Kenyon

[57] ABSTRACT

A method for measuring the potential waveform in an electronic component by means of a scanning electron beam in which the pulse sequence of the primary electron beam contains alternatingly a pulse sequence with a fixed reference phase with respect to the potential pattern of the measuring voltage, and a pulse sequence with a measuring phase which can be shifted over a phase range, with the potential difference between the reference phase and the measuring phases measured, permitting the contactless measurement and a display of the potential pattern on a picture screen.

4 Claims, 6 Drawing Figures

METHOD FOR THE CONTACTLESS MEASUREMENT OF THE POTENTIAL WAVEFORM IN AN ELECTRONIC COMPONENT AND APPARATUS FOR IMPLEMENTING THE METHOD

BACKGROUND OF THE INVENTION

This invention relates contactless measurements in general and more particularly to a method for the contactless measurement of the potential waveform in an electronic component, especially an integrated circuit, with a keyed electron beam which releases secondary electrons, at the measuring point, the energy of which is determined by the potential at the measuring point.

As is well known, the potential waveform in conductors of an integrated circuit can be measured by means of mechanical prod which is placed on the measuring point and the diameter of which, however, cannot be much smaller than a few $\mu m$ for reasons of mechanical strength. Highly integrated circuits, however, contain conductors which are only a few $\mu m$ wide and at which, therefore, a measurement with the mechanical prod is no longer possible. In addition, the capacity of the measuring prod is relatively large, so that measurements on dynamic circuits can become falsified.

Potential contrast measurements on integrated circuits are therefore made with a scanning electron microscope, in which the mechanical measuring prod is replaced by an electron beam, which can be focussed to a diameter of about 1 $\mu m$.

This primary electron beam releases secondary electrons from the metallic conductor at the measuring point; these secondary electrons are accelerated in an electric field and their energy can be measured in a retarding-field spectrometer. A cylindrical deflection capacitor leads the secondary electrons, via a declaration field, to the scintillator of an electron collector, which is followed by a control amplifier. The output voltage of the amplifier controls the grid voltage of the deceleration field. It holds its output voltage with respect to the voltage at the measuring point constant by means of a feedback loop. The grid voltage at the retarding field electrode of the spectrometer is readjusted until the voltage between the grid and the measuring point has again reached its original constant value. Then, the change of the grid voltage corresponds directly to the potential change at the measuring point of the sample.

Direct measurement of the potential waveforms of high frequency signals is not possible per se, because the amplifier cannot follow the high frequency signal. Therefore, a stroboscopic measurement in the manner of a sampling oscilloscope is used. The primary electron beam is keyed with the frequency of the signal to be measured and is switched-on during a very short time. This process is repeated often enough that a sufficient signal-to-noise ratio is obtained. Then, the phase of the electron pulse relative to the measuring voltage is shifted according to the so-called sampling principle, and the process is repeated often enough that at least one cycle of the measurement voltage is determined.

The sample is arranged in a high-vacuum system of the retarding-field spectrometer with a vacuum of about $10^{-5}$ Torr. The surface of the sample still contains relatively many residual gas molecules which can be cracked by the impinging electrons of the primary electron beam. Thereby, a contamination layer is formed at the surface of the measuring point, which supplies fewer secondary electrons than the metal of the conductor. Accordingly, a disturbance of the measurement results.

SUMMARY OF THE INVENTION

It is an object of the present invention to describe a measuring method for functional tests of electronic components which, due to the fineness of the structures, is free of mechanical contact and has a low capacity because of the high frequencies, and to which a computer-controlled test system can be connected. In addition, interfering influences due to contamination are to be precluded.

According to the present invention, this problem is solved by the provision that the pulse sequence of the primary electron beam contains alternatingly a pulse sequence with a fixed reference phase with respect to the potential waveform of the measuring voltage, and a pulse sequence with a measuring phase which can be adjusted over a phase range, and that the potential difference between the reference phases and the measurement phases is measured. Through this time delay modulation, the measurement variable is split into an a-c and a d-c component. Disturbances due to contamination are contained in the d-c component. The a-c component corresponds to the potential waveform of the measuring voltage at the sample and is therefore determined independently of the d-c component, preferably by means of a lock-in amplifier.

In an arrangement for implementing the method with a scanning electron microscope, which is equipped with a switching device for keying the primary electron beam, the keying device can be provided, for shifting the phase of the primary electron pulses with respect to the potential pattern of the measuring voltage at the measuring point in question, with a delay generator. The phase of output pulses of the delay generation is predetermined by a staircase generator, the step voltages of which always determine a measuring phase of the delay generator and which between the different step voltages, always delivers a constant reference voltage which determines the adjustable reference phase of the delay generator.

In this measuring arrangement, the mechanical measuring prod is replaced by the contactless, easily positioned and finely focussable as well as low-capacity electron beam. The electron beam scanning head is placed on the sample, which is arranged in a vacuum system. At the measuring point of the electronic component, the keyed primary electron beam generates secondary electrons which escape at the surface of the measuring point from a zone near the surface about 5 nm thick into the vacuum and the energy of which, with reference to a reference electrode, is determined by the potential at the measuring point and is determined by means of a spectrometer which is preferably a retarding-field spectrometer. The secondary electrons are drawn off by electrodes which are located above the component. With a voltage of, for instance, 300 V between the component and the suction electrodes, the secondary electrons are accelerated and fed to an electron collector which is followed by a control amplifier.

Through the time delay modulation, only the respective potential difference is measured and the control amplifier furnishes an output signal with an a-c component which corresponds to the measured voltage at the sample. It is a particular advantage of the arrangement that this a-c component can be measured in the output signal of the control amplifier with a lock-in amplifier, independently of the d-c component.

DETAILED DESCRIPTION OF THE INVENTION

Figure 1:
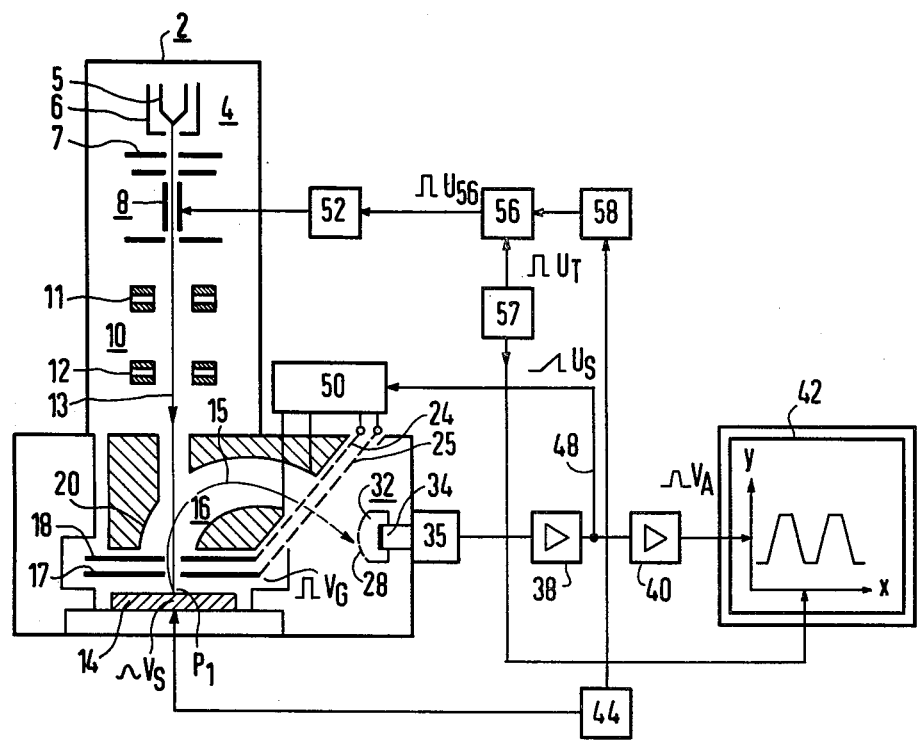
FIG. 1 is a diagrammatic illustration of an arrangement for implementing the method according to the present invention.

A scanning electron microscope 2, which contains an electron gun 4, a beam keying system 8, which is also called a chopper, as well as a beam deflection system 10, the control of which is not shown, is shown in FIG. 1. The electron gun 4 consists essentially of a cathode 5, a control electrode 6 and an anode 7. The beam deflection system 10 contains, for instance, a coil system with deflection coils 11 and 12, the magnetic field of which serves for positioning the primary electron beam 13 on a sample 14 which can preferably be an integrated electronic component, in the conductors of which the potential waveform of a measuring voltage $V_s$ is to be measured. The primary electron beam 13 releases secondary electrons 15, the energy of which serves as a measure of the potential at a measuring point $P_1$.

Above the sample 14, a retarding field spectrometer 16 is arranged, which contains a control electrode 17 and an anode 18, which serves as a suction electrode. A cylindrical deflection capacitor 20 is provided for deflecting the secondary electrons 15 which arrive, over a path indicated by an arrow, via the retarding field of two retarding field electrodes 24 and 25, at a detector 32 for the secondary electrons 15. The latter consists essentially of a screen grid 28 and a scintillator 34 with a light guide which is followed by a photo multiplier 35 and a control amplifier 38. A lock-in amplifier 40 detects the a-c component in the measuring signal and thereby reproduces the potential waveform of the measuring voltage.

The output signal $V_A$ of the lock-in amplifier 40 controls the deviation in the Y-direction, on a picture screen 42, i.e., the amplitude of the measuring voltage $V_s$. The deviation in the X-direction, i.e., the time axis, is controlled by the sawtooth voltage $U_s$ of a staircase generator 57, the staircase voltage $U_T$ of which controls the phase $\phi$ of the output pulses $U_{56}$ of a delay generator 56, which together with a pulse generator 52 is associated with the keying arrangement 8. Control logic 44 simultaneously controls the sample 14 and a rate generator 58 which serves as a pulse former for the delay generator 56.

The keying arrangement 8 for adjusting the phase of the pulses $E_p$ of the primary electron beam 13 with respect to the waveform of the measuring voltage $V_s$ can also be controlled by a computer, not shown. For this purpose, the associated control arrangement, i.e., the pulse generator 52, the delay generator 56 and the staircase generator 57, can be addressed digitally.

The output signal of the control amplifier 38 is fed, via a feedback loop 48, to a control device 50 for the spectrometer 16, which controls the retarding field of the electrodes 24 and 25 and the potential of the capacitor 20 as well as the suction electrodes 17 and 18.

Figure 2:
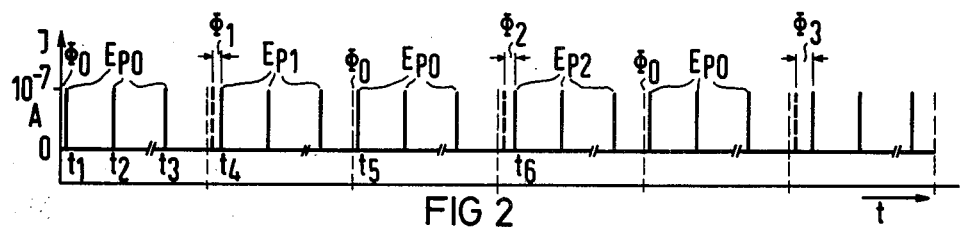
FIG. 2 shows the phase of the primary electron pulses.
Figure 3:
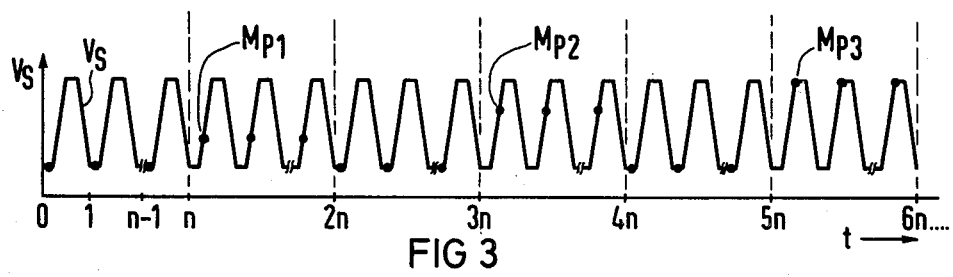
FIG. 3 shows the waveform of the measured voltage in respective diagrams.

According to FIG. 2, in which the pulses of the primary electron current I are plotted as a function of the time t, a primary electron pulse $E_{p_0}$ with the reference phase $\phi_0$ is to be applied at the times $t_1$, $t_2$ and $t_3$ to the measuring point $P_1$, for instance, on a conductor of an integrated circuit. The number of the pulses $E_p$ with the same phase depends on the number of electrons per pulse. Only 3 pulses $E_{p_0}$ are shown in the diagram. In the practical embodiment of the method, generally at least $n=100$ pulses and preferably, at least 1000 pulses are chosen. The pulses $E_{p_0}$ with the reference phase are always at the beginning of the rising edge of the periodic signal of the measuring voltage $V_s$, which is plotted in FIG. 3, as a function of the time t.

Figure 4:
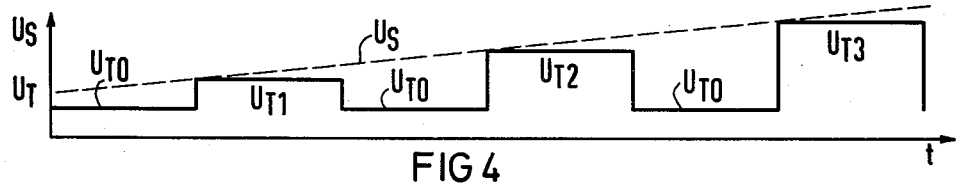
FIG. 4 illustrates the output voltages of the staircase generator.

According to FIG. 4, in which the sawtooth voltage $U_s$ and the staircase voltage $U_T$ of the staircase generator 57 are plotted, the reference phase is adjusted by the magnitude of the reference voltage $U_{T0}$ between the staircase voltages $U_{T2}$, $U_{T2}$ and $U_{T3}$ of the staircase generator 57. The repetition rate of the staircase voltage $U_T$ is chosen in a range from $3\times 10^{-2}$ Hz to about 100 Hz.

At the end of the sequence of reference pulses $E_{p_0}$, a pulse $E_{p_1}$ with the phase $\phi_1$ is applied to the measuring point $P_1$ at the times $t_4$, $t_5$ and $t_6$. This measuring phase $\phi_1$ is determined by the voltage $U_{T_1}$ of the first step of the staircase generator 57. According to FIG. 3, these pulses $E_{p_1}$ lie in the rising edge of the measuring voltage $V_s$.

At the time $t_5$, a sequence of pulses $E_{p_0}$, a pulse $E_{p_1}$ with the phase $\phi_1$ is applied again to the sample and at the time $t_6$, a sequence of pulses $E_{p_2}$ with the measuring phase $\phi_2$, which likewise lies in the rising edge of the measuring voltage $V_s$ and is determined by the magnitude of the voltage $U_{T_2}$. Similarly, the step voltage $U_{T_3}$ determines the measuring phase $\phi_3$. The phase $\phi$ is shifted until the measurement values over a phase range of the measuring voltage $V_s$, i.e., in general about one cycle of the measuring voltage $V_s$, are collected by the sampling principle.

In some cases it may be advantageous to also scan only part, for instance, the rising edge, of a cycle and to display it on the picture screen 42.

Figure 5:
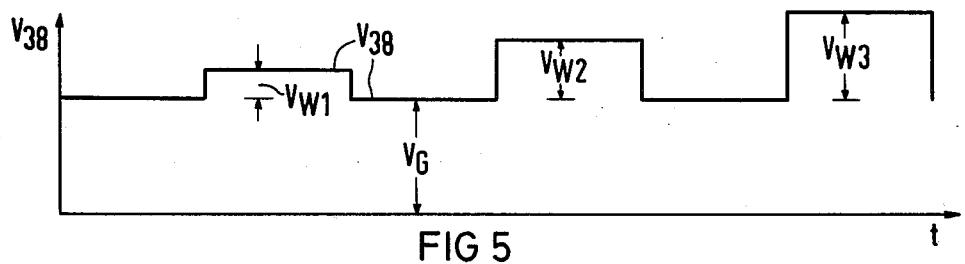
FIG. 5 illustrates the output voltage of the control amplifier.

According to FIG. 5, the output signal $V_{38}$ of the control amplifier 38 contains a d-c voltage $V_G$, on which an a-c component $V_w$ is superimposed.

Figure 6:
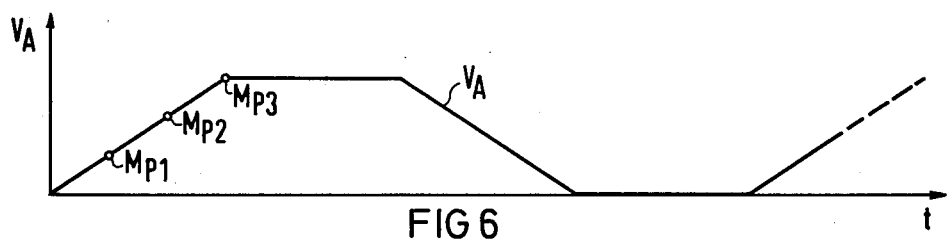
FIG. 6 illustrates the output voltage of the lock-in amplifier.

According to the diagram, FIG. 6, the lock-in amplifier 40 furnishes the output signal $V_A$ which is proportional to the amplitude $V_w$ of the a-c component of the amplifier output signal $V_{38}$. Corresponding to the measuring phases $\phi_1$, $\phi_2$ and $\phi_3$ according to FIG. 2, the corresponding measuring points $M_{p1}$, $M_{p2}$ and $M_{p3}$ lie on the rising edge of a cycle of the measuring voltage $V_s$, and with these values, the lock-in amplifier 40 furnishes the entire cycle which is shown in FIG. 6 and is displayed on the picture screen 42.

The flanks of the staircase voltage $U_T$ according to FIG. 4 lie in the microsecond range. During this time, the rate generator 58 is gated. In this manner, the primary electron beam 13 cannot strike the sample 14 during an undefinable phase and measurement errors cannot be caused thereby.

The repetition rate of the staircase voltage $U_T$ can be derived, for instance, from the frequency of the measuring voltage $V_s$ via a frequency divider in such a manner that it is within the bandwidth of, for instance, 300 kHz of the feedback loop 48. In that case, the feedback signal will contain the a-c component $V_w$, the amplitude of which is equal to the potential change between the reference phase $\phi_0$ and the measuring phases $\phi_1, \phi_2, \phi_3$. This a-c component is separated from the d-c component $V_G$ by the lock-in amplifier 40. The output signal $V_A$ of the lock-in amplifier 40 is then proportional to the voltage $V_s$ at the measuring point $P_1$. The signal is shown on the picture screen 42, the time axis x of which is controlled by the staircase generator 57 by means of a sawtooth voltage $U_s$.

The method according to the present invention for measuring the potential waveform in electronic components in the manner of a sampling oscilloscope with a contactless electron beam scanning head, as indicated in FIG. 1, can be used, for instance, in the incoming inspection of integrated circuits as well as for the quality control thereof. Because the electron beam can be focussed to a very small diameter and is easy to position, and because of its low capacity, this equipment can also be used for testing highly integrated circuits with correspondingly narrow conductors.

The measuring method can further be used for measuring the potential waveform in ferroelectric and piezoelectric components. In addition, measurements on ceramic barrier layer capacitors are possible.

What is claimed:

1. A method for measuring the potential waveform in an electronic component resulting from application of a measuring voltage thereto with a keyed primary electron beam which releases secondary electrons at the measuring point, the energy of which is determined by the potential at the measuring point, comprising:
   (a) generating a multiplicity of pulses of the primary electron beam which contains alternatingly a pulse sequence with a fixed reference phase with respect to the potential waveform of the measuring voltage and a pulse sequence with a measuring phase which is shifted with respect to the reference phase; and
   (b) measuring the potential difference between the reference phase and the measuring phase.

2. An arrangement for measuring the potential waveform in an electronic component resulting from the application of a measuring voltage with a keyed primary electron beam which releases secondary electrons at the measuring point, the energy of which is determined by the potential at the measuring point comprising:
   (a) a scanning electron microscope which is equipped with a keying device for the primary electron beam;
   (b) a retarding-field spectrometer which contains a secondary electron collector;
   (c) a control amplifier;
   (d) control logic which is coupled to the electronic component as well as to the keying devices;
   (e) a delay generator between said control logic and said keying device for the primary electron beams;
   (f) a staircase generator, the step voltages of which determine a respective measuring phase, providing inputs to said delay generator, said staircase generator also furnishing a constant reference voltage which determines an adjustable reference phase of the delay generator between the step voltages whereby a multiplicity of pulses of the primary electron beam which contains alternatingly a pulse sequence with a fixed reference phase with respect to the potential waveform of the measuring voltage and a pulse sequence with a measuring phase which is shifted with respect to the reference phase over a phase range will be generated.

3. Apparatus according to claim 2, and further including a lock-in amplifier coupling out the a-c component of the output signal of the control amplifier.

4. The method of claim 1 wherein the pulse sequences of said measuring phase generated alternatingly with said reference phase comprise a plurality of pulse sequences each shifted a different amount from said reference phase so as to traverse a range of phases.

* * * * *